(12) United States Patent
Yoon et al.

(10) Patent No.: US 7,324,394 B1
(45) Date of Patent: Jan. 29, 2008

(54) SINGLE DATA LINE SENSING SCHEME FOR TCCT-BASED MEMORY CELLS

(75) Inventors: Sei-Seung Yoon, Cupertino, CA (US); Jin-Man Han, Menlo Park, CA (US); Seong-Ook Jung, Cupertino, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 143 days.

(21) Appl. No.: 11/360,181

(22) Filed: Feb. 23, 2006

Related U.S. Application Data

(62) Division of application No. 10/977,309, filed on Oct. 29, 2004, now Pat. No. 7,006,398, which is a division of application No. 10/211,766, filed on Aug. 1, 2002, now Pat. No. 6,903,987.

(51) Int. Cl.
*G11C 7/00* (2006.01)

(52) U.S. Cl. .............. 365/205; 365/204; 365/207; 365/189.09; 365/149; 365/203

(58) Field of Classification Search .............. 365/205, 365/204, 207, 203, 189.09, 149
See application file for complete search history.

(56) References Cited

U.S. PATENT DOCUMENTS

| | | |
|---|---|---|
| 5,258,958 A | 11/1993 | Iwahashi et al. |
| 5,266,013 A | 11/1993 | Aubert et al. |
| 5,390,147 A | 2/1995 | Smarandoiu et al. |
| 5,544,097 A | 8/1996 | McClure et al. |
| 5,570,315 A | 10/1996 | Tanaka et al. |
| 5,572,465 A | 11/1996 | Bashir |
| 5,654,918 A * | 8/1997 | Hammick ............. 365/185.2 |
| 5,668,765 A | 9/1997 | Ang |
| 5,774,411 A | 6/1998 | Hsieh et al. |
| 5,953,249 A | 9/1999 | van der Wagt |
| 6,021,068 A | 2/2000 | Miki et al. |
| 6,021,072 A | 2/2000 | Takeda et al. |
| 6,049,494 A | 4/2000 | Sakui et al. |
| 6,088,277 A | 7/2000 | Kim et al. |
| 6,094,394 A | 7/2000 | La Rosa |
| 6,128,225 A | 10/2000 | Campardo et al. |

(Continued)

FOREIGN PATENT DOCUMENTS

JP             408096597        4/1996

(Continued)

*Primary Examiner*—Viet Q. Nguyen

(57) ABSTRACT

A sensing circuit including a sense amplifier to resolve a data signal generated by a memory cell is disclosed herein. The sensing circuit includes a bit line to receive the data signal, a first pre-charge device coupled to the bit line and configured to pre-charge the bit line, a device for providing a bias coupled to the bit line and configured to provide a bias to the bit line, and a reference node configured to be at least one pre-determined level. In one embodiment the pre-determined level is equal to a low potential such as ground and in another embodiment equal to a high potential such as $V_{DD}$. One or more switching devices allows for the activation or deactivation of the pre-charge device allowing to pre-charge the bit line to a certain potential and the sensing circuit quickly and accurately determines whether a logical state of '1' or '0' is being applied to the bit line.

13 Claims, 9 Drawing Sheets

U.S. PATENT DOCUMENTS

| | | |
|---|---|---|
| 6,191,978 B1 | 2/2001 | Watanabe et al. |
| 6,229,734 B1 | 5/2001 | Watanabe |
| 6,307,807 B1 | 10/2001 | Sakui et al. |
| 6,320,790 B1 | 11/2001 | Micheloni |
| 6,330,188 B1 | 12/2001 | Pascucci |
| 6,337,825 B2 | 1/2002 | Tanzawa et al. |
| 6,362,661 B1 | 3/2002 | Park |
| 6,480,419 B2 | 11/2002 | Lee |
| 6,522,594 B1 | 2/2003 | Scheuerlein |
| 6,611,452 B1 | 8/2003 | Han |
| 6,625,057 B2 | 9/2003 | Iwata |
| 6,744,672 B2 * | 6/2004 | Ohtani et al. ........... 365/185.21 |
| 6,903,987 B2 * | 6/2005 | Yoon et al. ................. 365/205 |
| 7,006,398 B1 * | 2/2006 | Yoon et al. ................. 365/205 |
| 7,242,607 B2 * | 7/2007 | Kim ........................... 365/149 |
| 2002/0089024 A1 | 7/2002 | Iwata |
| 2002/0163838 A1 | 11/2002 | Guterman et al. |
| 2003/0021154 A1 | 1/2003 | Lee |
| 2004/0001363 A1 | 1/2004 | King |

FOREIGN PATENT DOCUMENTS

| | | |
|---|---|---|
| JP | 410209304 A | 8/1998 |

* cited by examiner

SINGLE DATA LINE SENSING SCHEME FOR TCCT-BASED MEMORY CELLS

CROSS-REFERENCE TO RELATED APPLICATIONS

This application is a divisional of U.S. patent application Ser. No. 10/977,309 filed Oct. 29, 2004, now U.S. Pat. No. 7,006,398 which is divisional of U.S. patent application Ser. No. 10/211,766 filed Aug. 1, 2002, now U.S. Pat. No. 6,903,987 and is related to U.S. patent application Ser. No. 10/191,686, entitled "Bit Line Control and Sense Amplification for TCCT-Based Memory Cells," filed on Jul. 5, 2002, now U.S. Pat. No. 6,721,220. All these patent applications are hereby incorporated by reference.

BACKGROUND OF THE INVENTION

1. Field of the Invention

The present invention relates generally to integrated circuits, and in particular, to a novel method of single data line sensing of thinly capacitively-coupled thyristor ("TCCT")-based memory cells.

2. Description of Related Art

U.S. Pat. No. 6,229,161 issued to Nemati et al., incorporated herein by reference in its entirety, discloses capacitively coupled NDR devices for use as SRAM memory cells. The cells disclosed by Nemati et al. are hereinafter referred to as thinly capacitively coupled thyristor ("TCCT") based memory cells. FIG. 1 shows a pair of representative TCCT based memory cells 10 as disclosed by Nemati et al., and FIG. 2 shows a cross-section through one TCCT based memory cell 10 along the line 2-2. FIG. 3 shows a schematic circuit diagram corresponding to the embodiment illustrated in FIGS. 1 and 2. The TCCT based memory cell 10 includes an NDR device 12 and a pass transistor 14. A charge-plate or gate-like device 16 is disposed adjacent to, and in the case of the illustrated embodiment, surrounding, the NDR device 12. A P+ region 18 of the NDR device 12 is connected to a metallization layer 20 so that a first voltage $V_1$, such as $V_{ddarry}$, can be applied to the NDR device 12 through the P+ region 18. An N+ region of the NDR device 12 forms a storage node 22 that is connected to a source of the pass transistor 14. Where the pass transistor 14 is a MOSFET, it can be characterized by a channel length, L, and a width, W, where L is the spacing between the source and the drain, and W is the width of the pass transistor 14 in the direction perpendicular to the page of the drawing in FIG. 2. Assuming a constant applied voltage, a current passed by pass transistor 14 will scale proportionally to a ratio of W/L.

Successive TCCT based memory cells 10 are joined by three lines, a bit line 26, a first word line (WL1) 28, and a second word line (WL2) 30. The bit line 26 connects a drain 32 of pass transistor 14 to successive TCCT based memory cells 10. In a similar fashion, pass transistor 14 includes a gate 34 that forms a portion of the first word line 28. Likewise, the gate-like device 16 forms a portion of the second word line 30.

Memory arrays of the prior art typically include a large number of memory cells that are each configurable to be in either of two states, a logical "1" state or a logical "0" state. The memory cells are typically arranged in rows and columns and are connected to a grid of word lines and bit lines. In this way any specific memory cell can be written to by applying a signal to the appropriate word lines. Similarly, the state of a memory cell is typically manifested as a signal on one of the bit lines. In order to correctly interpret the state of the memory cell from the signal on the bit line, memory arrays of the prior art typically rely on some form of a reference signal against which the signal on the bit line is compared.

One type of memory array of the prior art uses SRAM cells for the memory cells. A conventional SRAM cell stores a voltage and includes two access ports, data and data-bar, where data-bar is a complementary signal to data and serves as a reference. A sensing circuit for the conventional SRAM cell compares the voltages of data and data-bar to determine whether the SRAM cell is storing a '1' or a '0.'

Another type of memory array of the prior art uses DRAM cells for the memory cells. A conventional DRAM cell is a capacitor and stores a charge to represent a logical state. When a DRAM cell is read it produces a voltage on a bit line. A typical reference cell for a DRAM memory array is a modified DRAM cell designed to store about half as much charge as the conventional DRAM cell. Accordingly, in a DRAM memory array the voltage produced by the DRAM cell is compared to the voltage produced by the reference cell to determine whether the DRAM cell is storing a '1' or a '0.'

In comparison to the conventional SRAM cell, a TCCT-based memory cell has only a single port, namely a bit line. In further comparison to both the SRAM and DRAM cells, the TCCT-based memory cell does not produce a voltage but instead produces a current. More specifically, TCCT-based memory cell has an "on" state wherein it generates a current that is received by the bit line. The TCCT-based memory cell also has an "off" state wherein it produces essentially no current.

A typical reference cell to be used in a memory array of TCCT-based memory cells should produce a reference current with an amount that is somewhere within the range defined by the currents generated by TCCT-based memory cell in the "on" and "off" states, and preferably about half the magnitude of the current generated by a TCCT-based memory cell in the "on" state. It is well known, however, that the amount of current produced by a TCCT-based memory cell 10 varies as a function of temperature, and also varies according to variations in manufacturing and operating conditions (i.e., voltages), among other things.

In a typical TCCT-based memory cell there is only one single bit line that is pre-charged to a ground state. In order to sense a bit line level, a sense amplifier needs a reference bit line level that is between ground and a bit line high level. For this reason, a long period of time (typically picoseconds) is needed to sense a large enough change in voltage between the bit line and the reference bit line. Also, the size of the architecture can get quite large when using reference cells because each bit line in a single or open bit line memory architecture can have from thirty-two to more than a thousand TCCT-based memory cells coupled thereto.

Therefore, what is desired is a memory cell and sensing scheme capable of generating a large enough voltage margin during the "on" state in a relatively shorter time frame. Also, it is desired to reduce the size of the memory cell architecture so that chip size can be reduced.

SUMMARY

The present invention provides for a system and method for single data line sensing of memory cells, typically TCCT-based memory cells. A sensing circuit including a sense amplifier to resolve a data signal generated by a memory cell is disclosed. The sensing circuit comprises a bit line coupled to the memory cell to receive the data signal, a first pre-charge device coupled to the bit line and configured to pre-charge the bit line, a device for providing a bias coupled to the bit line and configured to provide a bias to the bit line, and a reference node configured at a first pre-determined level coupled to the sensing circuit. The device for providing bias includes a first switchable device to reverse the polarity of the device for providing a bias. The sensing circuit further comprises a first node connected to a first input of the sense amplifier with the first node configured to couple with the bit line. A second switchable device exists to temporally couple the first node to the bit line.

The first pre-charge device includes a third switchable device to couple the bit line to a pre-charge node, where the pre-charge node is at a first pre-determined level. In one embodiment of the present invention, the first pre-determined level is a potential equivalent to ground. In another embodiment, the first pre-determined level is a relatively high potential. The sense amplifier comprises two cross-coupled inverters and includes a sensing power switchable device coupled between the sense amplifier and another potential to enable operation of the sense amplifier and a second pre-charge device coupled to the sense amplifier and configured to pre-charge the sense amplifier.

The second pre-charge device includes a fourth switchable device to couple the sense amplifier to a pre-charge node, where the sense amplifier pre-charge node is at a second pre-determined level. The second pre-determined level is a potential equivalent to ground or a relatively high potential. The sensing circuit further comprises a second node connected to a second input of the sense amplifier, the second node configured to couple with the reference node. A fifth switchable device exists to temporally couple the second node to the reference node. Additionally, sixth and seventh switchable devices are configured to communicate complementary signals from the first and second nodes, respectively. In these embodiments, the plurality of switchable devices are MOSFET devices.

In another embodiment, a method provides control of a sensing circuit, where the method includes pre-charging a first node to a pre-determined level, pre-charging a bit line to the pre-determined level, applying a bias to the bit line, floating the bit line, floating the first node and coupling the bit line to the first node, the first node associated with a first sense amplifier input.

BRIEF DESCRIPTION OF DRAWINGS

The present invention is illustrated by way of example, and not by way of limitation, in the figures of the accompanying drawings where like reference numerals frequently refer to similar elements and in which.

DETAILED DESCRIPTION OF THE INVENTION

Detailed descriptions of exemplary embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

The term "device" herein is used to describe both a discrete semiconductor circuit element, such as a MOS transistor or a TCCT device, as well as a semiconductor product. A memory semiconductor product can be referred also as a memory "chip" or "integrated circuit" and is a circuit element operating cooperatively with other semiconductor products, such as a microprocessor.

Although the following exemplary circuits and methods are described generally in conjunction with a read operation of a memory device, the disclosed circuits and methods are designed to accommodate write operations as well as like memory device operations.

Figure 3:
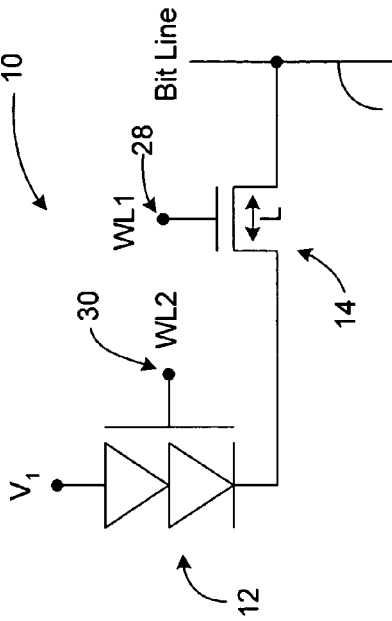
FIG. 3 shows a schematic circuit diagram of the TCCT based memory cell of FIG. 1.
Figure 1:
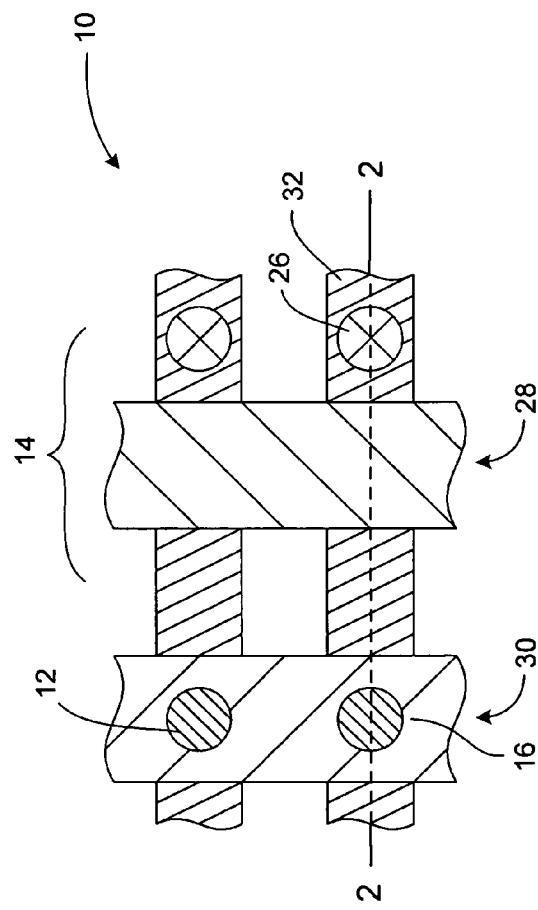
FIG. 1 shows a TCCT based memory cell of the prior art.
Figure 2:
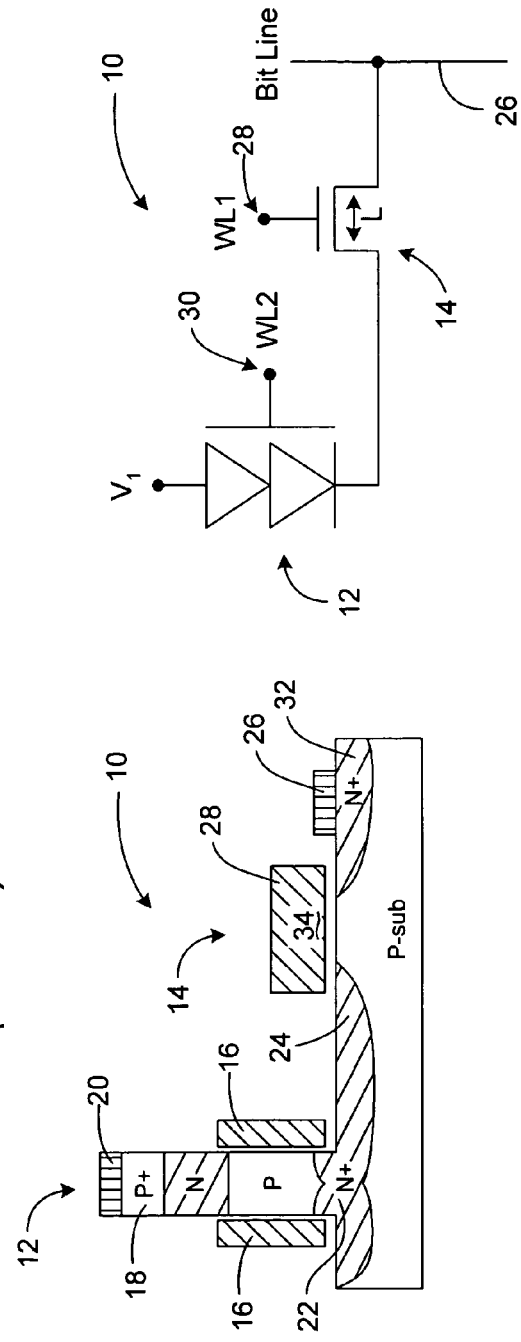
FIG. 2 shows a cross-section of the TCCT based memory cell of FIG. 1.
Figure 4:
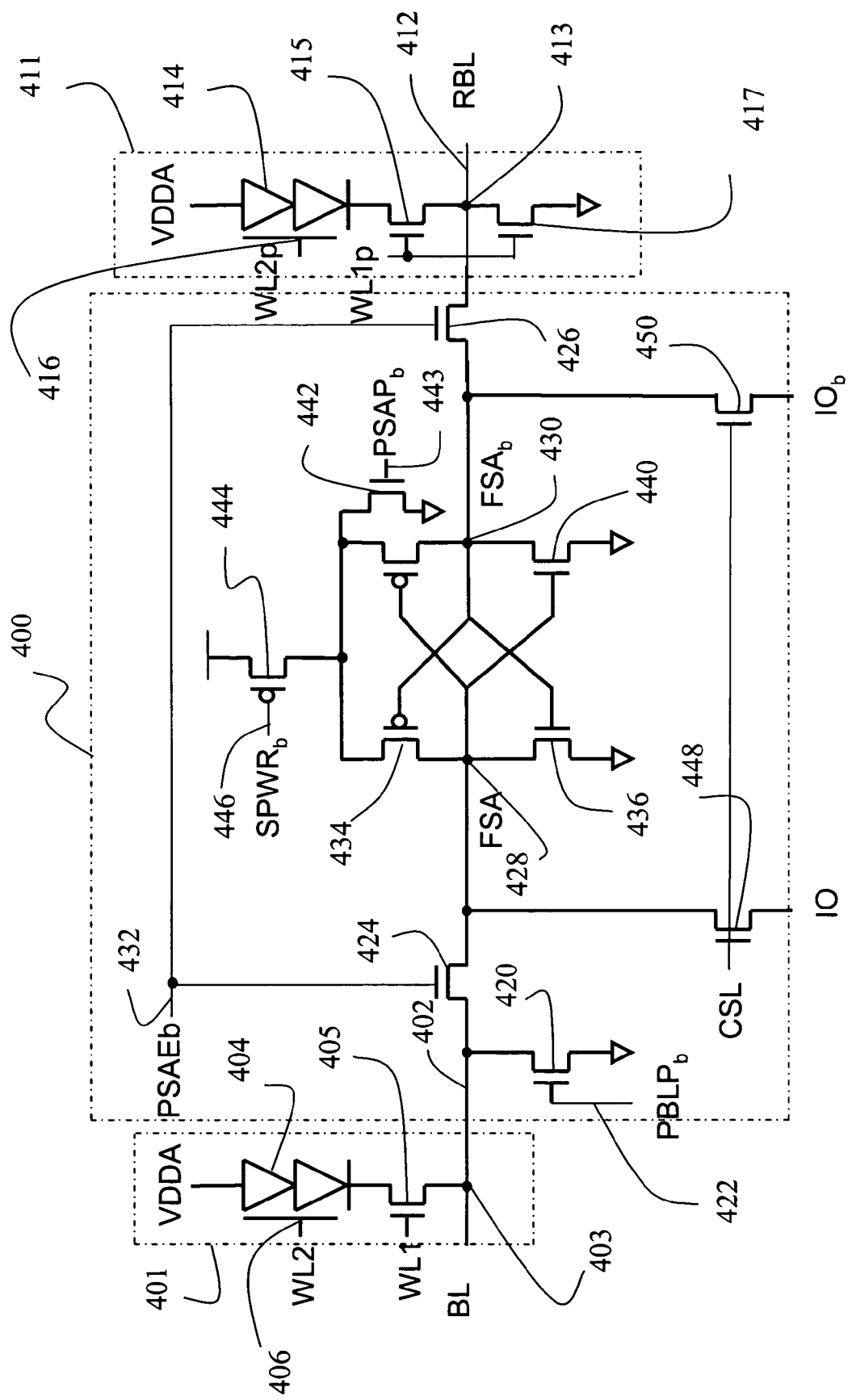
FIG. 4 shows a schematic circuit diagram of a data sensing scheme of the present invention.

FIG. 4 illustrates a sensing scheme of the present invention. In this embodiment, sensing circuit 400 is coupled to an NDR-based memory cell 401 by a bit line 402 and coupled to an NDR-based reference cell 411 by a reference bit line 412. In one embodiment, the NDR-based memory cell 401 and the NDR-based reference cell 411 are TCCT-based memory cells. The sensing circuit 400 operates to determine a datum stored in the NDR-based memory cell 401, or TCCT-based memory cell 401. The determination is made by comparing the voltage (or current) on the bit line 402 against that on the reference bit line 412.

TCCT-based memory cell 401 includes an NDR device 404 having an anode coupled to a relatively high potential, (i.e., $V_{DDA}$), and a cathode coupled to a terminal of a switchable device, such as a pass transistor 405. A switchable device can also be any other type of mechanism for providing switch-like functionality as is known in the art. In particular, a drain of pass transistor 405 is coupled to the cathode of NDR device 404 and a source of pass transistor 405 is coupled to the bit line 402 at a node 403. A gate-like device 406 of NDR device 404 and a gate of pass transistor 405 are designed to receive control signals, such as word lines two ("WL2") and one ("WL1"), respectively. In this case, pass transistor 405 is an n-channel metal oxide silicon ("NMOS") device, the operation, structure and manufacture of which is well known in the art.

TCCT-based reference memory cell 411 includes an NDR device 414 having an anode coupled to a relatively high potential, such as $V_{DDA}$ or other like voltages. Device 414 also has a cathode coupled to a terminal of a switchable device, such as a pass transistor 415. In particular, pass transistor 415 has a drain terminal coupled to the cathode of device 414, a source terminal coupled to reference bit line 412 at a node 413, and a gate terminal designed to receive reference word line one control signal ("WL1$_p$"). A suitable reference cell for use in practicing a specific embodiment of the prior art is disclosed in a patent application owned by common assignee T-RAM, Inc., which is entitled "Reference Cells for TCCT-Based Memory Cells," U.S. patent application Ser. No. 10/417,930, filed on Apr. 5, 2002, which is incorporated by reference herein for all purposes.

Reference memory cell 411 also includes a charge-plate or gate-like device 416 adjacent to NDR device 414 and designed to receive reference word line two control signal ("WL$2_p$"). The gate-like device 416 is designed to accommodate a WL$2_p$ signal capable of assuming an active level (e.g., $V_{DDA}$) to activate 414 or an inactive level (e.g., ground) to deactivate 414. More specifically, the WL$2_p$ signal operates in a similar fashion as WL2 associated with memory cell 401. A person having ordinary skill in the art should appreciate that the WL$2_p$ signal, however, need not operate exactly as WL2, because reference cell 411 need only operate in read mode to provide a pre-reference voltage signal in which to generate a reference signal. The pre-reference voltage is substantially equivalent to a magnitude of a data signal representing a logical one, as provided by memory cell 401.

Reference cell 411 further includes a resistive element, such as a pull-down transistor 417. Device 417 is coupled between reference bit line 412 and a relatively low potential for clamping, or limiting, the voltage on reference bit line 412 to a level appropriate for resolving the data signal on bit line 402 into a logical signal (i.e., logical one or zero). That is, device 417 operates to reliably generate and provide a reference signal having a voltage substantially proportional to the maximum voltage reached on the bit line 402, and preferably about half of that maximum voltage. A margin on either side of the reference signal is represented in the figures as "delta $V_{BL}$" and is described in connection with FIG. 5. Although the relatively low potential in FIG. 4 is shown to be ground, one having ordinary skill in the art will appreciate that the low potential can be any voltage lower than $V_{DDA}$, including potentials below ground.

Devices 415 and 417 are configured to operate as a voltage divider that uses the pre-reference voltage (or current) from device 414. In particular, devices 415 and 417 are designed such that the pre-reference voltage is divided across individual devices 417 and 415, either equally or differently, to provide a reference voltage at reference bit line 412. For example, if devices 417 and 415 have approximately the same resistance, then the voltage drop across each device 417 and 415 is equivalent. Thus, if devices 404 and 414 respectively produce a data signal and a pre-reference signal having substantially the same magnitude, then the reference signal (i.e., voltage on the reference bit line) is about one-half of the data signal.

Sensing circuit 400 includes a differential amplifier for sensing whether the magnitude of the data signal representing the unit of data is a logical one or zero. In the example shown in FIG. 4, sensing circuit 400 includes a switchable device, such as NMOS transistor device 420 for equalizing the amount of charge on bit line 402 to ground or any other potential level by, for example, discharging excess charge (i.e., pre-charging the bit line 402 to ground). With excess charge discharged, signal propagation is faster and more reliable than if excess charge is left on signal lines in which data and reference signals are applied. The device 420 has a drain coupled to the bit line 402, a gate configured to receive pre-charge bit line control signal ("PBLP$_b$") 422 and a source coupled to a relatively low potential, such as ground. Upon receiving control signal PBLP$_b$ 422 in one state, device 420 activates to provide a path to the low potential (i.e., ground) so as to pre-charge the bit line 402 to the low potential.

Sensing circuit 400 also includes sense amplifier enable devices 424 and 426. Devices 424 and 426 function to enable signals on bit line 402 and reference bit line 412 to be applied to nodes FSA 428 and FSA$_b$ 430, respectively, which are input terminals of the exemplary sense amplifier 400 shown in FIG. 4. Each sense amplifier enable device 424 and 426 has a first terminal (e.g., drain) coupled to respective nodes FSA 428 and FSA$_b$ 430, a second terminal (e.g., source) coupled respectively to bit line 402 and reference bit line 412, and a gate configured to receive sense amplifier enable control signal ("PSAE$_b$") 432. When devices 424 and 426 receive control signal PSAE$_b$ 432, they activate to provide paths from memory cell 401 to node FSA 428 and from reference cell 411 to node FSA$_b$ 430.

The sense amplifier 400 shown in FIG. 4 is a cross-coupled inverter pair, each inverter composed of complementary metal oxide semiconductor ("CMOS") transistor devices. More specifically, the sense amplifier 400 includes a first inverter having an output terminal connected to an input terminal of a second inverter, and the second inverter's output terminal is connected to an input terminal of the first inverter.

The first CMOS inverter includes p-channel MOSFET ("PMOS") device 434 and NMOS device 436 in a cross-coupled configuration with the second CMOS inverter. The second inverter includes PMOS device 438 and NMOS device 440. NMOS devices 436 and 440 each have a source terminal coupled to a low potential such as ground. A drain terminal of device 434 is coupled to a drain terminal of device 436 at node FSA 428, and similarly, a drain terminal of device 438 is coupled to a drain terminal of device 440 at node FSA$_b$ 430. Device 434 has a source terminal coupled to a common node (i.e., PMOS source node) to which a source terminal of device 438 is also coupled.

A switchable device 442 having a gate configured to receive a pre-charged sense amplifier control signal ("PSAP$_b$") 443, in this example an NMOS transistor, is coupled to devices 434, 438 and 444 and used to pre-charge devices 434 and 438 to established reliably equalized nodes 428, 430 of the sense amplifier similar to how the bit line 402 is pre-charged, as described above. Device 444, in this example, a switchable device such as a PMOS transistor device, is coupled between the PMOS source node and a relatively high potential, such as $V_{DD}$. In particular, device 444 has a source terminal coupled to $V_{DD}$, a drain terminal coupled to the PMOS source node (and thus to the source terminals of devices 434, 438 and 444), and a gate terminal configured to receive a sensing power control signal ("SPWR$_b$") 446. Device 444 operates to provide power to the sense amplifier during the sensing stages of a memory read cycle for enabling the functionality of the sense amplifier. One having ordinary skill in the art will appreciate that in certain applications device 444 is optional and that the PMOS source node can be connected directly to $V_{DD}$. In other embodiments, a switchable device similar in functionality to device 444, but suited for operation with devices 436 and 440, can be coupled between the sources of devices 436 and 440.

Sensing circuit 400 further includes input/output transistor devices 448 ("IO") and 450 ("IO$_b$"). Each input/output device 448 and 450 has a first terminal (e.g., drain) coupled to respective nodes FSA 428 and FSA$_b$ 430, a second terminal (e.g., source) coupled to a relatively low potential, such as ground, and a gate configured to receive a column select control signal ("CSL"). In operation, a control signal CSL is applied to activate 448 and 450 for transmitting complementary sense amplifier output signals representing a resolved data signal, such as a logical one or zero. Such outputs can be sent to either a global sense amplifier, complementary input/output lines, or to other circuitry in which the processing of the data signal is desired.

Figure 5:
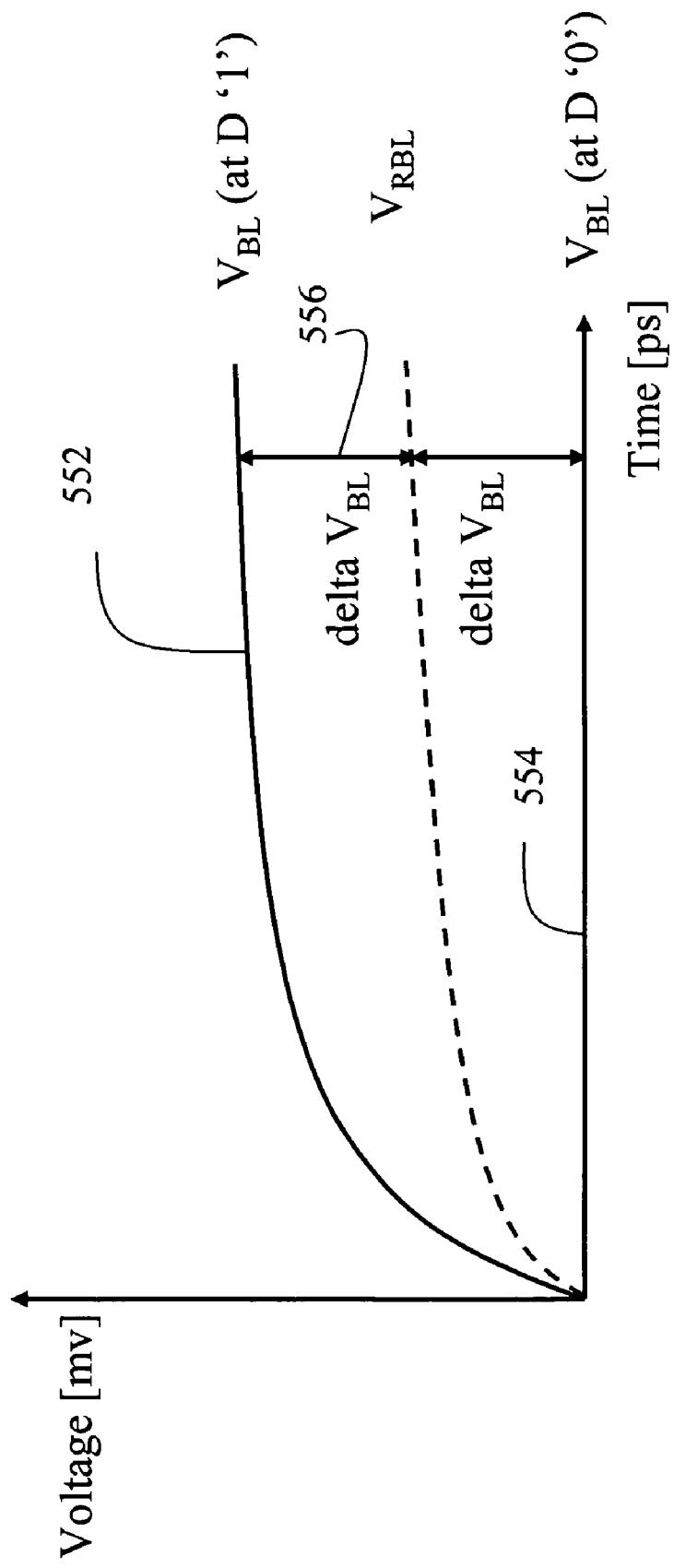
FIG. 5 shows the bit line waveform voltage of the sensing scheme of FIG. 4.

FIG. 5 is a bit line voltage diagram of the TCCT memory and reference cells 401, 411 of FIG. 4. In this example, TCCT-based memory cell 401 of FIG. 4 while operating in read mode (i.e. when at least WL1 is activated) provides a data signal to bit line 402 for determining the logical value of the stored unit of data. When a logical state of "one" is read from NDR device 404 and applied to the bit line 402, the data signal generated by memory cell 401 has an exemplary voltage profile (i.e., magnitude over time) such as shown as "D 1" 552 of FIG. 5. Likewise, when a logical state of "zero" is applied to bit line 402, the data signal generated by memory cell 401 is shown having a magnitude over time as "D 0" 554 of FIG. 5, which is a negligible voltage and hence can be equivalent to a ground potential. In some embodiments, the magnitudes of a data signal representing a logical one (i.e., D '1') and logical zero (i.e., D '0') are configured to be approximately 200 millivolts ("mV") and 0 mV, respectively. While the bit line voltage for bit line 402 can follow either of two profiles, "D 1" or "D 0", the reference bit line voltage ($V_{RBL}$) is set to always follow a single profile, as shown in FIG. 5. Ideally, $V_{RBL}$ is equal to about ½ $V_{BL}$ (for D=1) at any point in time so that an equal margin delta $V_{BL}$ exists above and below $V_{RBL}$. However, this relationship is not essential, and the invention also works when the two margins on either side of $V_{RBL}$ are not equal. In the embodiments where $V_{BL}$ (at D '1') rises to 200 mV, $V_{RBL}$ ideally will rise to about 100 mV.

Figure 6:
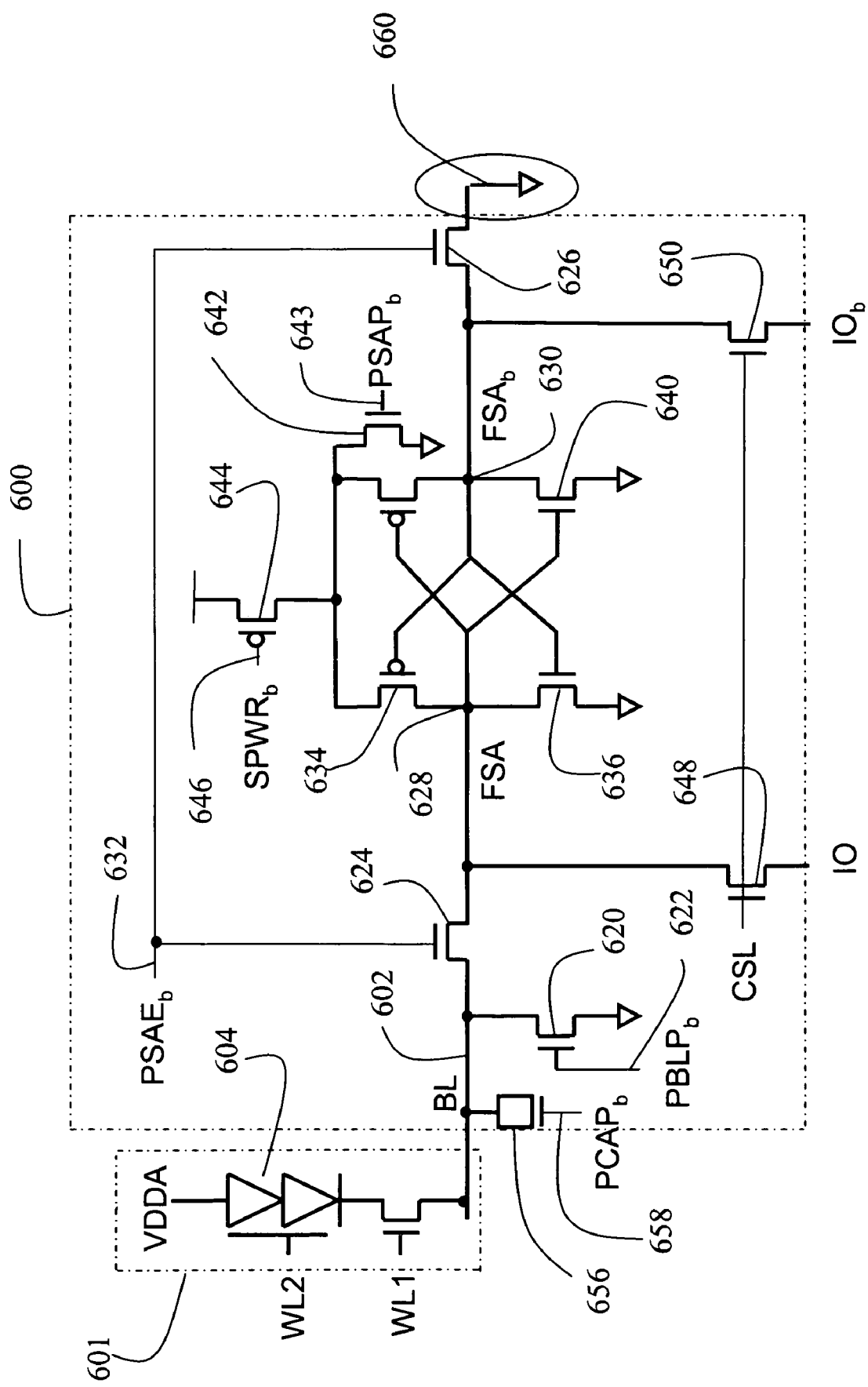
FIG. 6 shows a schematic circuit diagram of an exemplary example of a sensing scheme in accordance with one embodiment of the invention.

FIG. 6 shows an exemplary sensing circuit 600 in accordance with a specific embodiment of the present invention. In this example, memory cell 601 is similar in function and structure to memory cell 401 of FIG. 4. The individual circuit elements of sensing circuit 600 of FIG. 6 are similar in structure and functionality to the individual circuit elements of sensing circuit 400 of FIG. 4. Additional devices not found in sensing circuit 400 of FIG. 4 have been incorporated in sensing circuit 600 to address problems.

In FIG. 6, an NMOS capacitor device 656, is coupled to bit line 602. In particular, device 656 contains a gate configured to receive a capacitor control signal ("$PCAP_b$") 658. In addition, reference memory cell 411 in FIG. 4 has been eliminated and replaced with a reference node 660 coupled to a relatively low potential such as a ground. The elimination of reference memory cell 411 in FIG. 4 and the addition of device 660 in FIG. 6 in this exemplary embodiment of the present invention provides advantages over the prior embodiment and the prior art. The elimination of reference memory cell 411 in FIG. 4 creates a space savings on the chip so that chip size can be reduced. Capacitor device 656 of the present invention is similar to the other devices in the present invention such that it is a MOSFET device. Capacitor device 656 is designed with the drain and source terminals shorted together and a gate used to provide charge. It may be possible, however, to use devices with similar properties to achieve the same result in place of capacitor device 656.

Figure 7:
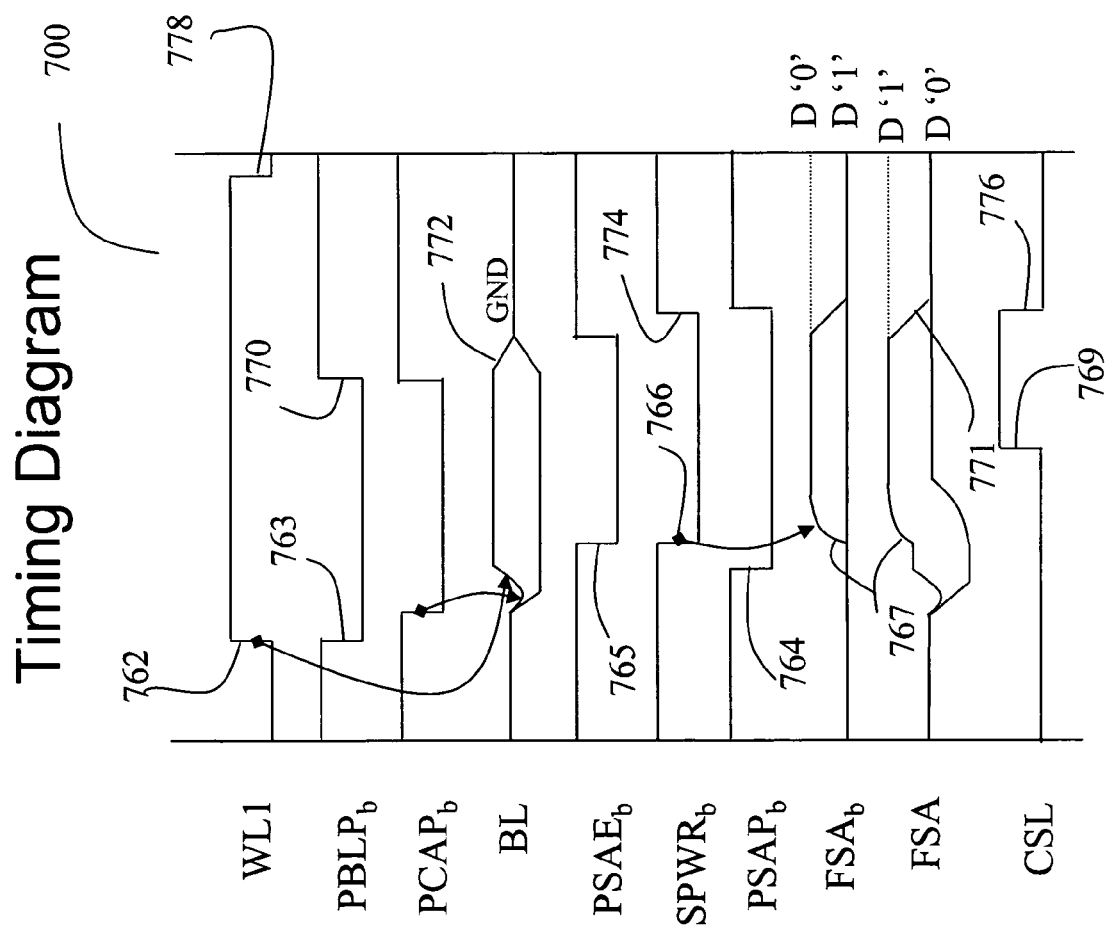
FIG. 7 shows a read cycle timing diagram of the sensing scheme of FIG. 6.

FIG. 7 is a timing diagram illustrating an exemplary timing sequence and control signal relationship when activating and deactivating circuit elements of exemplary sensing circuit 600 of FIG. 6. FIG. 7 also depicts timing and levels of circuit elements acted upon by the control signals, such as bit lines and nodes FSA, etc.

Prior to an exemplary read operation (i.e., prior to edge 762 in FIG. 7) WL1 is deactivated so that device 605 isolates device 604 from bit line 602, and control signal $PBLP_b$ is activated so that device 620 can pre-charge bit line 602. In some embodiments, pre-charging takes bit line 602 to ground or 0 mV. Further, $PSAE_b$ is activated so that device 624 couples bit line 602 to node FSA 628 and so that device 626 couples reference node 660 to node $FSA_b$ 630. In this exemplary embodiment, reference node 660 is at a relatively low potential or ground. Prior to the read operation $PCAP_b$ is high thereby causing negative charges to accumulate on the capacitor plate coupled to bit line 602. Additionally, $SPW_b$ is activated so that device 644, being an NMOS device, decouples the sense amplifier from its voltage source, and $PSAP_b$ is activated such that any excess charge existing on the sense amplifier is dissipated. Finally, CSL is deactivated so that device 648 decouples node FSA 628 from IO and so that device 650 decouples node $FSA_b$ 630 from $IO_b$.

During an exemplary read operation, at signal transition or edge 762 of FIG. 7, word line one ("WL1") is activated to read a data signal representing a stored unit of data onto bit line 602 of FIG. 6. At exactly the same time or slightly before, at edge 763, $PBLP_b$ 622 is deactivated so that device 620 is isolated from bit line 602. Thereafter, $PCAP_b$ 658 goes from high to low thereby switching polarity of device 656. Device 656 as mentioned above, prior to $PCAP_b$ 658 going from high to low, has a negative charge on the capacitor plates coupled to bit line 602. Switching the polarity of device 656 allows the negative charges to bias bit line 602. Typically, the value of the negative charge produced by device 656 is about 10% of $V_{DD}$, but can vary depending upon the capacitance of device 656. At a time after WL1 is activated at edge 762, the voltage on bit line 602 will follow one of two voltage profiles shown in FIG. 8 depending whether the stored unit of data being read represents a logical one (Data '1') or zero (Data '0'). It will be appreciated from a comparison of FIG. 8 to FIG. 5 that the bias added to bit line 602 by device 656 shifts both voltage profiles lower by approximately Delta $V_{BL}$. This voltage profile is also illustrated in FIG. 7 as the change in voltage at node FSA 628.

At edge 764, $PSAP_b$ 643 is deactivated and device 642 is isolated from the sense amplifier to discontinue the equalization of nodes FSA 628 and $FSA_b$ 630. Next, at or near edge 765, $PSAE_b$ 632 is removed from devices 624 and 626 of FIG. 6 to isolate node FSA 628 from bit line 602 and to isolate node $FSA_b$ 630 from reference node 660. Once this occurs, WL1 can be deactivated again to isolate device 604 from bit line 602, and $PBLP_b$ can again be activated so that device 620 can pre-charge bit line 602. Before or approximately at the same time, $PCAP_b$ 658 can be applied thereby allowing device 656 to again store charge.

Approximately at or near the time of edge 765, at edge 766 control signal $SPWR_b$ 646 of FIG. 6 is removed from device 644 to couple the sense amplifier to its voltage source to provide, for example, $V_{DD}$ thereto. Thereafter, at edge 767 the voltages at nodes FSA 628 and $FSA_b$ 630 resolve depending upon whether a Data '1' or Data '0' scenario is present. For example, where the voltage on node FSA 628 is high to represent a logical one, the voltage at node $FSA_b$ 630 remains at ground. Alternatively, when FSA 628 is low to represent a logical zero, the voltage at node $FSA_b$ 630 is driven from ground to a higher voltage. When the voltages on the two nodes 628, 630 have stabilized the nodes 628, 630 are said to be latched.

Once the sense amplifier has latched nodes FSA 628 and $FSA_b$ 630, control signal CSL at or near edge 769 activates devices 648 and 650 to couple nodes FSA 628 and $FSA_b$ 630 to IO and $IO_b$, respectively. Thus a logical one is read by applying a relatively high voltage on IO and a relatively low voltage on $IO_b$, and a logical zero is read by applying a relatively low voltage on IO and a relatively high voltage on $IO_b$.

After the complementary sensed data signals have been transferred to IO and $IO_b$, control signal CSL of FIG. 7 at edge 776 changes states so as to deactivate devices 648 and 650 of FIG. 6 to isolate nodes FSA 628 and $FSA_b$ 630 from IO and $IO_b$, respectively. If WL1 has not been previously deactivated it may be deactivated at this time. Similarly, if $PBLP_b$ 622 has not yet been activated it may be activated at this time so bit line 602 can pre-charge to ground.

Before or approximately at the same time control signal $PCAP_b$ 658 goes high to yet again switch the polarity of device 656. At edge 772, bit line 602 reaches a ground state. Before or approximately at the same time, $PSAE_b$ 632 activates devices 624 and 626 to allow FSA 628 and $FSA_b$ 630 to also pre-charge to ground. Thereafter, at edge 774 control signal $SPWR_b$ 646 activates device 644 and control signal $PSAP_b$ 643 activates device 642 to dissipate any excess voltage (or current) in the sense amplifier.

Once all of the control signals have been restored to their respective pre-read operation levels, at edge 771 the voltage on nodes 628, 630 equalize and return to about ground or ≈0 mV. If WL1 has not been deactivated at this time, at edge 778, WL1 is deactivated.

Figure 8:
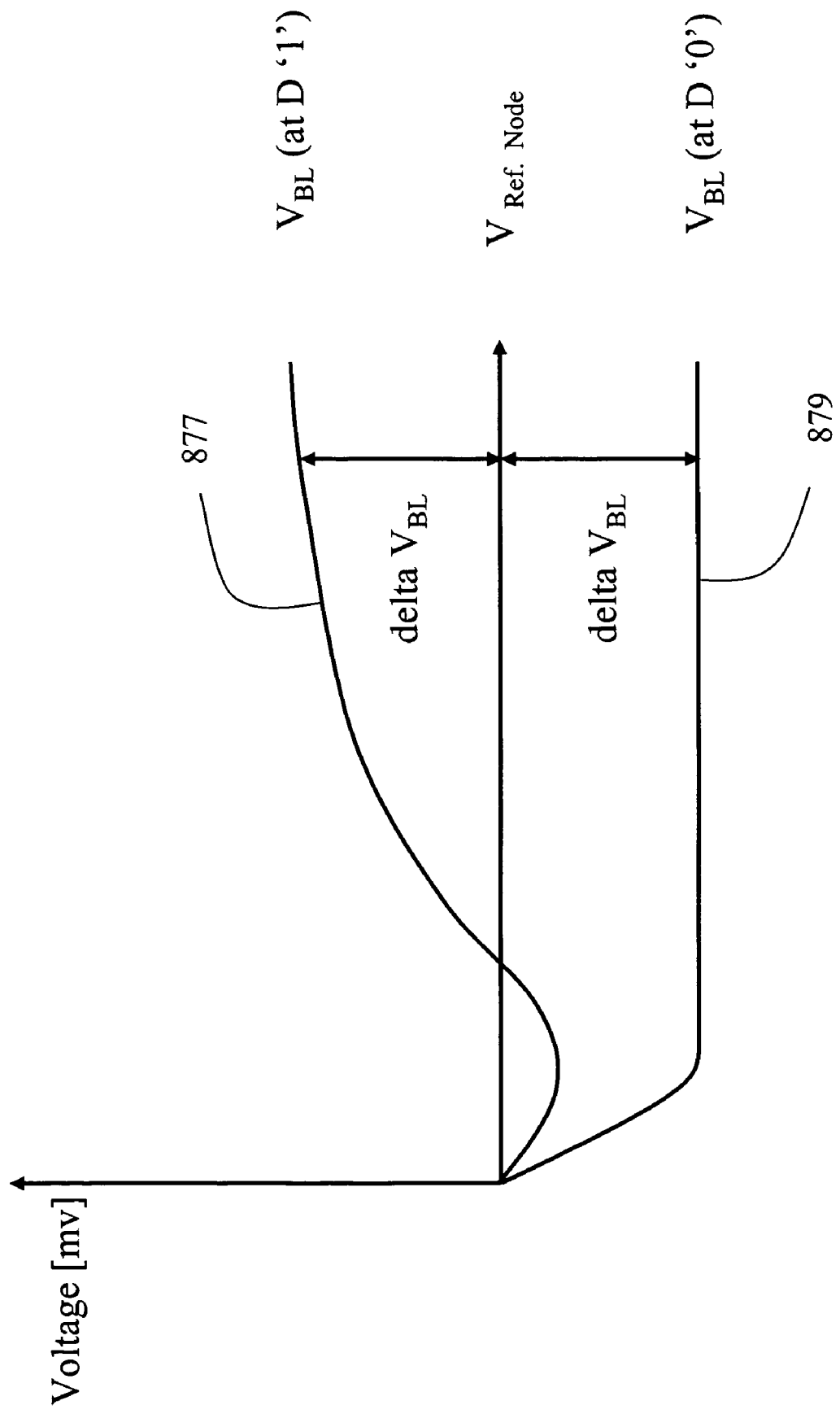
FIG. 8 shows the bit line waveform voltage of the sensing scheme of FIG. 6.

FIG. 8 illustrates voltage rise profiles for bit line 602 achieved in accordance with the exemplary embodiment shown in FIG. 6 when operated according to the timing diagram in FIG. 7. When a logical state of "one" is read from device 604 and applied to bit line 602 in FIG. 6, an exemplary voltage profile (i.e., magnitude over time) on bit line 602 such as shown as "D 1" 877 of FIG. 8 is achieved. Likewise, when a logical state of "zero" is applied to bit line 602 in FIG. 6, a voltage profile is achieved on bit line 602 as shown as "D 0" 879 of FIG. 8. In this exemplary embodiment, it can be seen that because device 656 (FIG. 6) applies a negative bias of about –delta $V_{BL}$ (approximately 120 mV in this embodiment) to bit line 602 whenever a data signal is read, that data signal is reduced by delta $V_{BL}$. By comparison with FIG. 5, the effect of device 656 is to shift D '1' and D '0' lower by equal amounts.

Figure 9:
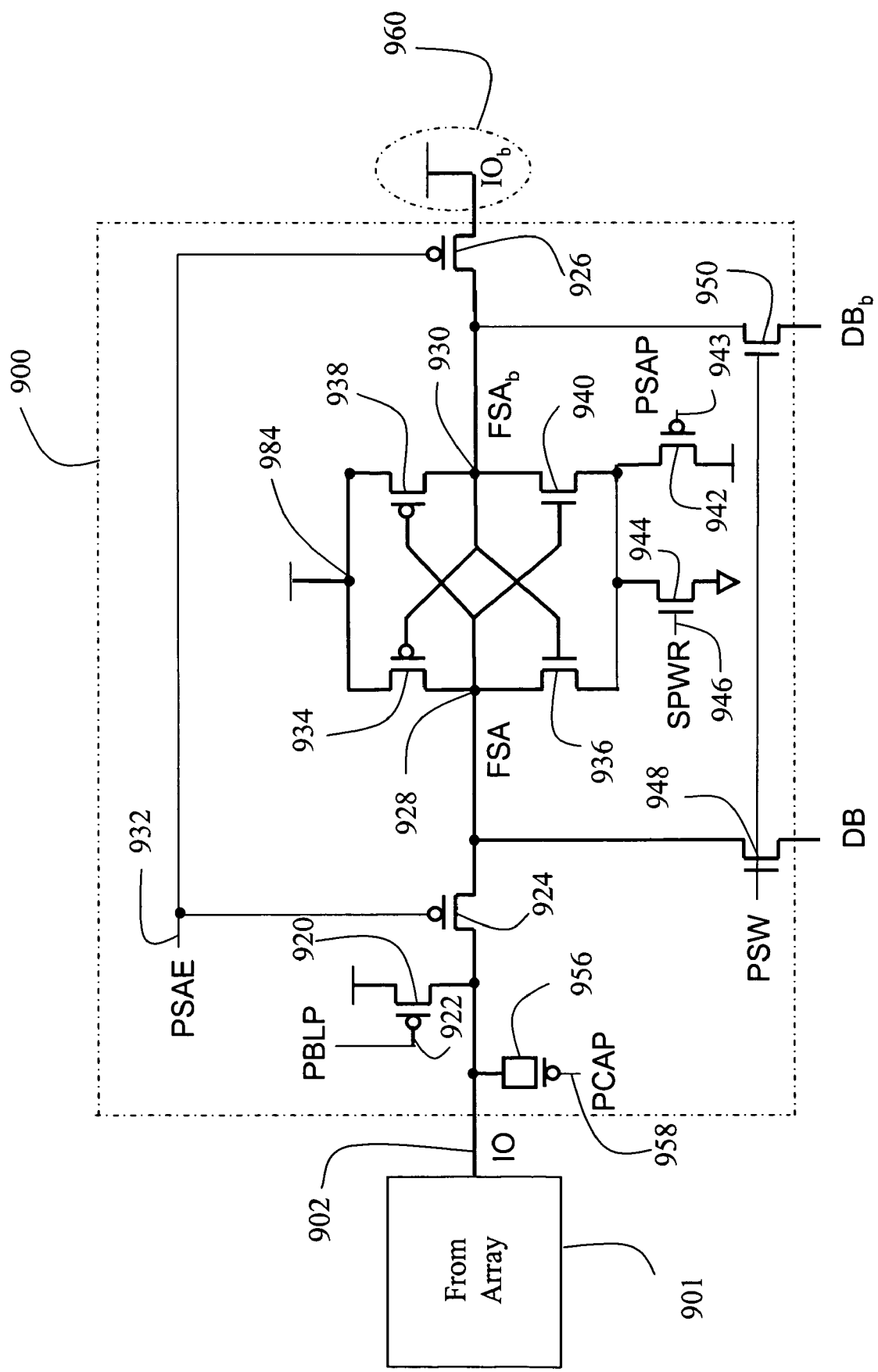
FIG. 9 shows a schematic circuit diagram of another example of a sensing scheme in accordance with another embodiment of the invention.

FIG. 9 shows yet another exemplary sensing circuit 900 in accordance with another specific embodiment of the present invention. In FIG. 9, the exemplary sensing circuit 900 shows a global sense amplifier setup as opposed to a local sense amplifier of the prior embodiment. FIG. 9 shows another embodiment that allows for a decrease in chip size over the prior art. In some embodiments, IO line 902 is a continuation of IO shown in FIG. 6 and $IO_b$ node 960 in these embodiments replaces $IO_b$ in FIG. 6. In this example, array 901 is an array sensing circuits each having similar function and structure as sensing circuit 600 in FIG. 6. The individual circuit elements of sensing circuit 900 of FIG. 9 are similar in structure and functionality to the individual circuit elements of sensing circuit 600 in FIG. 6.

Compared to FIG. 6, however, certain devices in the embodiment of FIG. 9 have been reconfigured. In FIG. 9, device 956 is a PMOS capacitor device instead of NMOS. In particular, device 956 contains a gate configured to receive a capacitor control signal ("PCAP") 958. Further, $IO_b$ node 960, representing $IO_b$ in this embodiment, is coupled to a relatively high potential (i.e., $V_{DD}$). This embodiment, similarly to the embodiment of FIG. 6, allows for a smaller chip size because a node replaces the line for $IO_b$. Sense amplifier enable devices 924 and 926 are PMOS devices each having a gate configured to receive sense amplifier enable control signal ("PSAE") 932. Device 920 is a PMOS device having a source terminal coupled to a relatively high potential (i.e., $V_{DD}$), a gate configured to receive pre-charged bit line control signal ("PBLP") 922, and a drain terminal coupled to IO line 902. In this example, devices 934 and 938 have source terminals coupled to a common node 984 of a relatively high potential (i.e., $V_{DD}$). Further, device 936 has a source terminal coupled to the drain terminal of device 934 at node FSA 928 and a drain terminal coupled to the drain terminal of NMOS device 940, and NMOS device 940 has a source terminal coupled to the drain terminal of device 938 at node $FSA_b$.

In the example shown in FIG. 9, a switchable device, such as NMOS transistor device 944, is coupled between the NMOS drain node and a relatively low potential, such as ground. In particular, device 944 has a source terminal coupled to ground, a drain terminal coupled to the NMOS drain node and a gate configured to receive a sensing power control signal ("SPWR") 946. Device 944, in this example, operates to connect the sense amplifier to ground during the sensing stage of the memory read cycle. Also in this example, a switchable device, such as a PMOS transistor device 942, is coupled between the NMOS drain node and a relatively high potential, such as $V_{DD}$. In particular, device 942 has a source terminal coupled to the NMOS drain node (and thus to devices 936 and 940), a drain terminal coupled to a relatively high potential (i.e., $V_{DD}$), and a gate configured to receive a pre-charged sense amp control signal ("PSAP") 943. Device 942, in this example, is designed to pre-charge the sense amplifier to a relatively high potential (i.e., $V_{DD}$).

Figure 10:
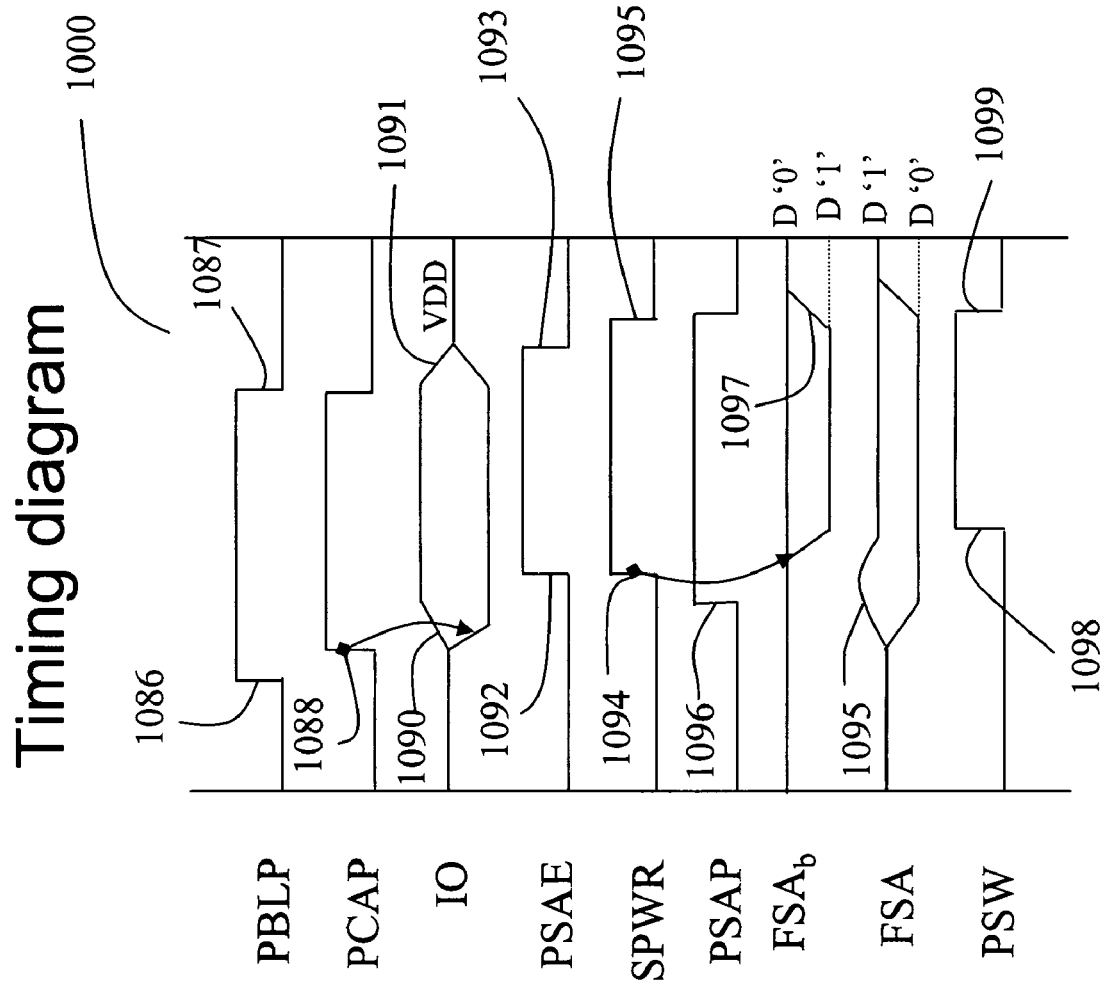
FIG. 10 shows a read cycle timing diagram of the sensing scheme of FIG. 9.

FIG. 10 shows a timing diagram 1000 illustrating an exemplary time sequence and control signal relationship when activating and deactivating circuit elements of exemplary sensing circuit 900 of FIG. 9. FIG. 10 also depicts timing and levels of circuit elements acted upon by the control signals, such as input/output lines IO and nodes FSA, etc.

Prior to an exemplary read operation control signal PBLP 922 is removed from device 920 so that a power source, such as $V_{DD}$, is coupled to IO line 902, thereby pre-charging IO line 902. In some embodiments, pre-charging takes IO line 902 to a relatively high potential (i.e., $V_{DD}$). In addition, PCAP 958 is low thereby allowing positive charge to accumulate on the capacitor plate coupled to IO line 902. Further, PSAE 932 is removed so that device 924 couples IO line 902 to node FSA 928 and so that device 926 couples $IO_b$ node 960 to $FSA_b$ 930. In this exemplary embodiment, $IO_b$ node 960 is at a relatively high potential or $V_{DD}$. Control signal SPWR 946 is deactivated so that device 944 decouples the sense amplifier from a relatively low potential while PSAP 943 is deactivated coupling the sense amplifier to a relatively high potential (i.e. $V_{DD}$). Finally PSW is deactivated so that device 948 decouples node FSA 928 from IO line 902 and so that device 950 decouples node $FSA_b$ 930 from $IO_b$ node 960.

In this embodiment, edge 1086 will occur at some period in time between edges 769 and 776 of FIG. 7. At edge 1086, control signal PBLP 922 of FIG. 9 is applied to device 920 so that device 920 is isolated from IO line 902, thereby ending the pre-charge of IO line 902. At some time thereafter, at edge 1088 PCAP 958 goes from low to high thereby switching the polarity of device 956 such that the charge associated with the capacitor plate and PCAP 958 can bias IO line 902. Device 956, prior to activation by PCAP 958 has a positive charge on the capacitor plates coupled to IO line 902. Typically, the value of the positive charge produced by device 656 is 10% of $V_{DD}$, but can vary depending upon the capacitance of device 656. When PCAP 958 goes from low (i.e., ground) to high (i.e., $V_{DD}$) the charge that has been building dissipates onto IO line 902. At a time after read operation 1000 begins, the voltage on IO line 902 will follow one of two voltage profiles shown in FIG. 11, at signal transition 1090 of FIG. 10, depending on whether the stored unit of data being read represents a logical one (Data '1') or zero (Data '0'). This voltage profile is also illustrated in FIG. 10 as the voltage at node FSA 928. Some time thereafter, at edge 1096, PSAP 943 is applied to device 942 and device 942 is isolated from the sense amplifier.

Next, at or near edge 1092, PSAE 932 is applied to devices 924 and 926 thereby isolating node FSA 928 from IO line 902 and node $FSA_b$ from $IO_b$ node 960. At this time, the read from the array 901 can be deactivated and thereby isolated from IO line 902, and PLBP 922 can again be removed so that device 920 can pre-charge IO line 902.

Approximately at or near the time of edge 1092, at edge 1094 control signal SPWR 946 of FIG. 9 is activated thereby coupling device 944 to the sense amplifier and allowing current to flow through the sense amplifier from the voltage source to provide, for example, $V_{DD}$ thereto. At edge 1095 the voltages at nodes FSA 928 and $FSA_b$ 930 resolve depending upon whether a Data '1' or Data '0' scenario is present. In this embodiment, in the Data '0' scenario, the pre-charge voltage (having approximately 5.5 V (5 V ($V_{DD}$)+0.50 V (delta $V_{BL}$))) on IO line 902 is grounded by device 936 of FIG. 9 and therefore the voltage on IO line 902 is rapidly driven to zero and the voltage at $IO_b$ node is 5 V. This has the affect of activating devices 936 and 938 and will take FSA 928 to ground and $FSA_b$ 930 to $V_{DD}$. In this embodiment, in the Data '1' scenario, the voltage on IO line 902 is 5.5 V and the voltage at $IO_b$ node is 5 V. This has the affect of activating devices 934 and 940 and will take FSA 928 to $V_{DD}$ and $FSA_b$ 930 to ground.

When the voltages on the two nodes 928, 930 have stabilized the nodes 928, 930 are said to be latched. Once the sense amplifier has latched nodes FSA 928 and $FSA_b$ 930, control signal PSW at or near edge 1098 activates devices 948 and 950 to couple nodes FSA 928 and $FSA_b$ 930 to DB and $DB_b$, respectively. Thus a logical one is read by applying a relatively high voltage on DB and a relatively low voltage on $DB_b$, and a logical zero is read by applying a relatively low voltage on DB and a relatively high voltage on $DB_b$. After the complimentary sensed data signals have been transferred to DB and $DB_b$, control signal PSW of FIG. 10 at edge 1099 changes states so as to deactivate devices 948 and 950 of FIG. 9 to isolate nodes FSA 928 and $FSA_b$ 930 from DB and $DB_b$, respectively.

Thereafter, at edge 1087, PBLP 922 is removed from device 920 and before or approximately at the same time control signal PCAP 958 goes from high to low and IO line 902 pre-charges to a relatively high potential, or $V_{DD}$. At or near edge 1091, IO line 902 reaches $V_{DD}$. Before or approximately at the same time, control signal PSAE 932 is removed from devices 924 and 926 to allow FSA 928 and $FSA_b$ 930 to also pre-charge to a relatively high potential. Thereafter, at edge 1095 control signal SPWR 946 deactivates device 944 and control signal PSAP 943 is removed from device 942 to pre-charge the sense amplifier to a relatively high potential.

Once all the control signals have been restored to their respective pre-read operation levels, at edge 1097 the voltage on nodes 928, 930 equalize and return to a relatively high potential (i.e., $V_{DD}$).

Figure 11:
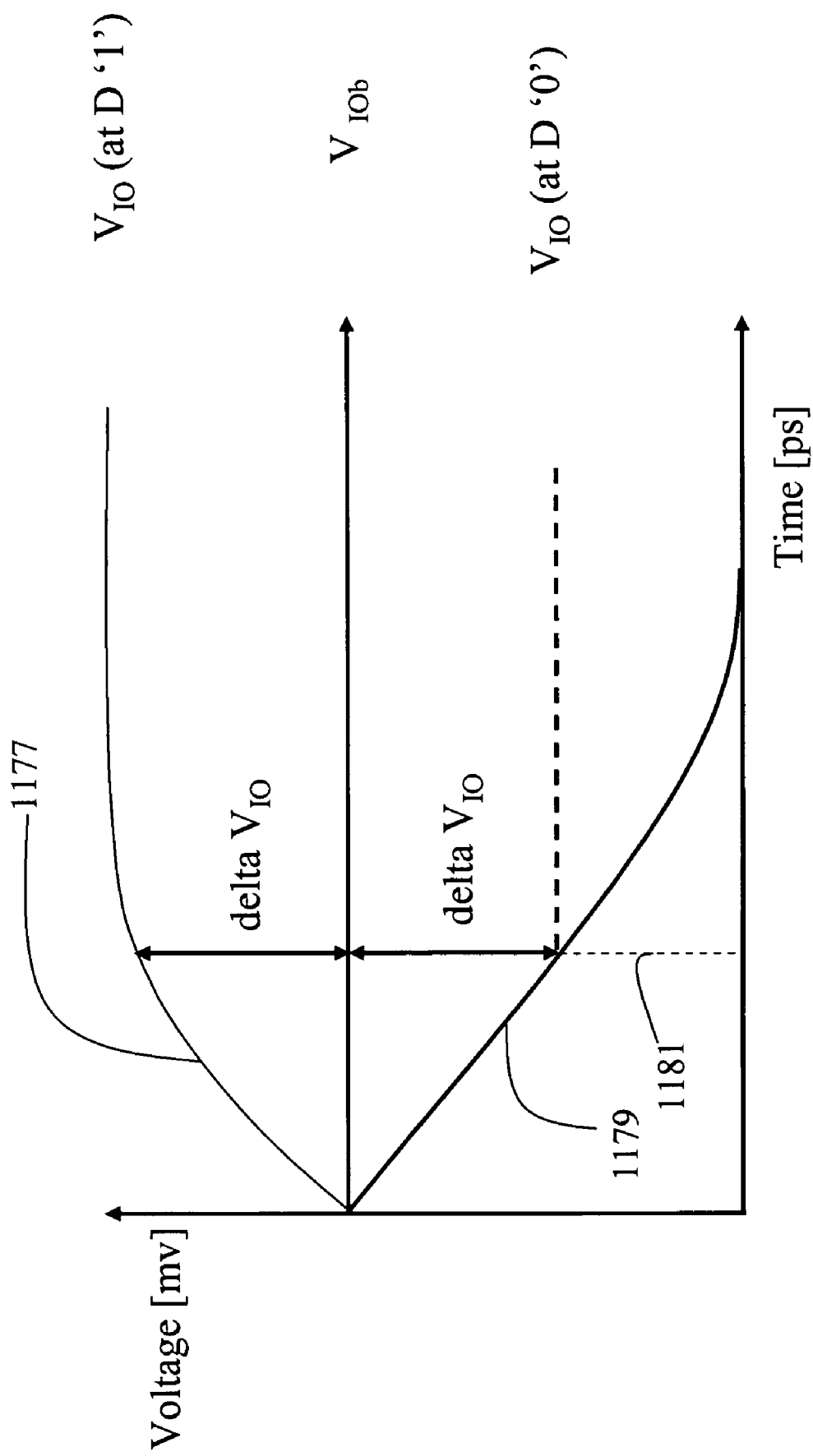
FIG. 11 shows the bit line waveform voltage of the sensing scheme of FIG. 9.

FIG. 11 illustrates voltage rise profiles achieved in accordance with the exemplary embodiment shown in FIG. 9. When a logical state of "one" is applied to IO line 902 in FIG. 9, an exemplary voltage profile (i.e., magnitude over time) on IO line 902 such as shown in D '1' 1177 of FIG. 11 is achieved. Likewise, when a logical state of "zero" is applied to IO line 902 in FIG. 9 a voltage profile is achieved on IO line 902 as shown as D '0' 1179. In this exemplary embodiment, it can be seen that because device 956 (FIG. 9) applies a bias of about +delta $V_{IO}$ to IO line 902 whenever a data signal is read, that data signal is increased by delta $V_{IO}$. By comparison with FIG. 8, the effect of device 956 is to shift D '1' by an amount (i.e., delta $V_{IO}$) so that at one instance the voltage on FSA 928 is greater than the voltage on $FSA_b$ 930. Sensing typically occurs at or around time 1181 when a significant value for delta $V_{IO}$ is reached.

Although the present invention has been discussed with respect to specific embodiments, one of ordinary skill in the art will realize that these embodiments are merely illustrative, and not restrictive, of the invention. For example, although the above description describes an exemplary memory cell as a TCCT-based memory cell, it should be understood that the present invention relates to any memory cell type in general and need not be restricted to use in TCCT memory arrays. For example, Magnetoresistive Random Access Memory ("MRAM"), Ferroelectric Random Access Memory ("FRAM"), SRAM, DRAM, and other memory types can be deployed in the architecture herein or modified herein to accommodate the specific memory type. Furthermore, any memory type can provide a basic structure for a reference memory cell in which a memory cell is compared thereto.

Various features and aspects of the above-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. The scope of the invention is not limited to the described embodiments and is to be determined solely by the appended claims.

What is claimed is:

1. A method of controlling a sensing circuit, the method comprising:
   floating a bit line;
   pre-charging a first node to a first pre-determined level;
   pre-charging the bit line to a second pre-determined level;
   applying a bias to the bit line; and
   coupling the bit line to the first node, the first node associated with a first sense amplifier input.

2. The method of claim 1, further comprising floating the first node.

3. The method of claim 1, further comprising transferring a data signal from a memory cell onto the bit line.

4. The method of claim 3, wherein the memory cell is a TCCT-based device.

5. The method of claim 3, further comprising resolving the data signal including:
   applying the data signal from the bit line to the first node;
   decoupling the bit line and the first node; and determining a logical value in which the data signal represents.

6. The method of claim 5, further comprising enabling operation of a sense amplifier.

7. The method of claim 1, wherein the coupling of the bit line to the first node is approximately near or prior in time to the application of the data signal from the bit line to the first node.

8. The method of claim 1, the method further comprising:
floating a reference node;
pre-charging a second node to a third pre-determined level;
pre-charging the bit line to a fourth pre-determined level; and
coupling the reference node to the second node, the second node associated with a second sense amplifier input.

9. The method of claim 8, further comprising floating the second node.

10. The method of claim 9, further comprising transferring a reference signal from the reference node onto the bit line.

11. The method of claim 10, further comprising:
applying the reference signal from the reference node to the second node; and
decoupling the reference node and the second node.

12. The method of claim 8, wherein the first, the second, the third and the fourth pre-determined levels are equivalent to ground.

13. The method of claim 8, wherein at least one of the first, the second, the third and the fourth pre-determined levels is substantially equivalent to power supply potential.

* * * * *